(12) United States Patent
Popescu

(10) Patent No.: US 11,953,572 B2
(45) Date of Patent: Apr. 9, 2024

(54) METHOD FOR ASCERTAINING A MAGNETIC FIELD OF AT LEAST ONE MAGNETIC COIL UNIT OF A MAGNETIC RESONANCE APPARATUS, MAGNETIC RESONANCE APPARATUS AND COMPUTER PROGRAM PRODUCT

(71) Applicant: Siemens Healthcare GmbH, Erlangen (DE)

(72) Inventor: Stefan Popescu, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 0 days.

(21) Appl. No.: 17/831,415

(22) Filed: Jun. 2, 2022

(65) Prior Publication Data

US 2022/0404446 A1    Dec. 22, 2022

(30) Foreign Application Priority Data

Jun. 16, 2021   (EP) .................................... 21179707

(51) Int. Cl.
*G01R 33/54* (2006.01)
*G01R 33/385* (2006.01)

(52) U.S. Cl.
CPC ........... *G01R 33/54* (2013.01); *G01R 33/385* (2013.01)

(58) Field of Classification Search
CPC .. G01R 33/54; G01R 33/385; G01R 33/3802; G01R 33/387; G01R 33/56518; G01R 33/56563; G01R 33/56572; G01R 33/243
See application file for complete search history.

(56) References Cited

U.S. PATENT DOCUMENTS 4,617,516 A * 10/1986 Schenck .............. G01R 33/385
324/309
5,055,791 A    10/1991 Leroux et al.
(Continued)

FOREIGN PATENT DOCUMENTS

| EP | 1582886 A1 | 10/2005 |
| EP | 1748300 A1 | 1/2007 |
| EP | 4040178 A1 | 8/2022 |

OTHER PUBLICATIONS

Bernstein, Mat A., et al. "Concomitant gradient terms in phase contrast MR: analysis and correction." Magnetic resonance in medicine 39.2 (1998): 300-308.

(Continued)

*Primary Examiner* — G. M. A Hyder
(74) *Attorney, Agent, or Firm* — Lempia Summerfield Katz LLC

(57) ABSTRACT

A method for ascertaining a magnetic field of at least one magnetic coil unit of a magnetic resonance apparatus, a magnetic resonance apparatus, and a computer program product are provided. According to the method, the magnetic field is generated by the at least one magnetic coil unit. A plurality of magnetic field vectors are detected at different positions of the magnetic field by a magnetic field sensor unit, where each magnetic field vector of the plurality of magnetic field vectors describes a strength, such as a magnitude, and a direction of the magnetic field at the respective position. The magnetic field is ascertained. To ascertain the magnetic field based on the plurality of magnetic field vectors, a model of a vector field is ascertained.

17 Claims, 7 Drawing Sheets

(56) References Cited

U.S. PATENT DOCUMENTS

| | | | |
|---|---|---|---|
| 6,664,879 B2* | 12/2003 | Forbes | G01R 33/3875 |
| | | | 324/320 |
| 7,208,951 B2 | 4/2007 | Pruessmann et al. | |
| 7,332,912 B2 | 2/2008 | Pittaluga et al. | |
| 10,018,690 B2 | 7/2018 | Overweg et al. | |
| 2004/0070396 A1* | 4/2004 | DeMeester | G01R 33/3873 |
| | | | 324/309 |
| 2015/0338475 A1 | 11/2015 | Overweg et al. | |
| 2016/0103194 A1* | 4/2016 | Schulz | G01R 33/481 |
| | | | 324/309 |
| 2018/0231622 A1* | 8/2018 | Hetz | A61B 5/055 |
| 2018/0292502 A1 | 10/2018 | Atalar et al. | |
| 2020/0069293 A1 | 3/2020 | Julian et al. | |
| 2021/0244330 A1* | 8/2021 | Shapiro | A61B 5/6803 |

OTHER PUBLICATIONS

Vannesjo, S. Johanna, et al. "Image reconstruction using a gradient impulse response model for trajectory prediction." Magnetic resonance in medicine 76.1 (2016): 45-58.

* cited by examiner

FIG 4

| 1 | SSH | VSH | | |
|---|---|---|---|---|
| | | $F_x$ | $F_y$ | $F_z$ |
| 0 | 1 | n. a. | n. a. | n. a. |
| 1 | x | 1 | 0 | 0 |
| | y | 0 | 1 | 0 |
| | z | 0 | 0 | 1 |
| 2 | xy | y | x | 0 |
| | zy | 0 | z | y |
| | $2z^2-x^2-y^2$ | $-2x$ | $-2y$ | $4z$ |
| | xz | z | 0 | x |
| | $x^2-y^2$ | $2x$ | $-2y$ | 0 |
| 3 | $3x^2y - y^3$ | $6xy$ | $3x^2 - 3y^2$ | 0 |
| | xyz | yz | xz | xy |
| | $4yz^2 - x^2y - y^3$ | $-2xy$ | $4z^2 - x^2 - 3y^2$ | $8yz$ |
| | $2z^3 - 3x^2z - 3y^2z$ | $-6xz$ | $-6yz$ | $6z^2 - 3x^2 - 3y^2$ |
| | $4xz^2 - x^3 - xy^2$ | $4z^2 - 3x^2 - y^2$ | $-2xy$ | $8xz$ |
| | $x^2z - y^2z$ | $2xz - y^2$ | $-2yz$ | $x^2 - y^2$ |
| | $x^3 - 3xy^2$ | $3x^2 - 3y^2$ | $-6xy$ | 0 |

METHOD FOR ASCERTAINING A MAGNETIC FIELD OF AT LEAST ONE MAGNETIC COIL UNIT OF A MAGNETIC RESONANCE APPARATUS, MAGNETIC RESONANCE APPARATUS AND COMPUTER PROGRAM PRODUCT

This application claims the benefit of European Patent Application No. EP 21179707.1, filed on Jun. 16, 2021, which is hereby incorporated by reference in its entirety.

BACKGROUND

The present embodiments relate to a method for ascertaining a magnetic field of at least one magnetic coil unit of a magnetic resonance apparatus, a magnetic resonance apparatus, and a computer program product.

In the field of medical engineering, imaging by magnetic resonance (MR), also known as magnetic resonance tomography (MRT) and magnetic resonance imaging (MRI) is characterized by high soft tissue contrast. This typically involves positioning a human or animal patient in an imaging volume of a magnetic resonance apparatus. During a magnetic resonance measurement, radio-frequency excitation pulses are usually radiated into the patient with the aid of a radio-frequency antenna unit of a magnetic resonance apparatus. This should be distinguished from a magnetic field generated by a magnetic coil unit of the magnetic resonance apparatus, which usually includes a static main magnetic field and/or a gradient magnetic field. The main magnetic field (e.g., the $B_0$ field) is generated by a main magnet (e.g., a superconducting main magnet). Further, a gradient coil unit of the magnetic resonance apparatus is used to generate gradient magnetic fields (e.g., gradient pulses) that are usually used for spatial encoding. The gradient coil unit may include a plurality of gradient coils, where each gradient coil of the plurality of gradient coils is configured to generate a gradient magnetic field (e.g., a partial gradient magnetic field) in a specific spatial direction (e.g., X, Y and Z). The generated transmit pulses excite nuclear spins in the patient. As a result of this, spatially encoded magnetic resonance signals are triggered. The magnetic resonance signals are received by the magnetic resonance apparatus and used to reconstruct magnetic resonance images.

Throughout the following disclosure, bold symbols are used to denote vector quantities (e.g., B is the vector value of the magnetic field) and normal symbols are used to denote the magnitude of these vectors (e.g., B=|B|).

Certain boundary conditions are generally assumed as being ideal for the magnetic field used for the generation and spatial encoding of the magnetic resonance signals.

It is, for example, assumed that the strength of the main static magnetic field $B_0$ in an imaging volume (e.g., in a field of view (FOV)) is homogeneous or has a uniform distribution with a precision of less than a few parts per million (ppm). It is further, for example, assumed that the field lines of the magnetic field are perfectly straight and/or extend parallel to one another, in that, for example, the static magnetic field $B_0$ is oriented along a Z direction (e.g., an axial Z direction; $B_0=BZ_0$), and that there are no transversal components in directions X and Y, which are orthogonal to the Z direction (e.g., $BX_0=BY_0=0$). It is further assumed that a gradient magnetic field is generated by a gradient coil for generating a gradient magnetic field in a specific direction is also exclusively oriented along this direction and that the strength of the magnetic field changes linearly and proportionally. For example, a gradient coil for generating a gradient magnetic field in the Z direction is assumed to generate a gradient magnetic field that is oriented exclusively along the Z direction (e.g., axial Z direction) and that the strength of the magnetic field BZ0 changes linearly and proportionally to the spatial coordinate (x,y,z): $BZ(x,y,z)=BZ_0+GX \cdot x+GY \cdot y+GZ \cdot z$ with $BX(x,y,z)=BY(x,y,z)=0$ Unfortunately, when performing a magnetic resonance measurement, the real conditions sometimes deviate greatly from the above-described idealized conditions due to various error sources. For example, it has been known for a long time that gradient coils do not generate an ideal magnetic spatial encoding field. Thus, the magnetic field gradients are not perfectly linear, and this causes geometric distortions in the magnetic resonance images. Further, actual magnetic fields generated by gradient coils also have components that are not parallel, but orthogonal to the desired direction. Such orthogonal components are also referred to as "concomitant" terms or Maxwell terms (e.g., in M. A. Bernstein et al., *Concomitant gradient terms in phase contrast MR: Analysis and correction*, Magnetic Resonance in Medicine, 39, 2, (300-308), (2021)). These terms are an unavoidable consequence of the physical laws of nature (described by Maxwell's equations), which require that the magnetic vector field is to have vanishing divergence within the imaging volume (e.g., divergence equals zero) and a negligible rotation.

A further problem is associated with the eddy currents induced by the gradient coil unit in electrically conductive parts of the magnetic resonance apparatus (e.g., the housing of a superconducting magnet and/or in the cryo-shields). These eddy currents generate additional and highly non-linear orthogonal magnetic fields that are superimposed on the original gradient field causing additional encoding errors in the magnetic resonance signals.

All these error sources may generate artifacts in the reconstructed magnetic resonance images. In the past, attempts have been made to reduce these artifacts. One approach is to use a commercially available dynamic field camera (DFC). This camera includes multiple active magnetic field probes for measuring the strength of the magnetic field at certain positions on the surface of a sphere enclosing an imaging volume. Methods for determining a magnetic field are also described in the publications U.S. Pat. No. 5,055,791A and US20150338475A1.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an improved method for determining a magnetic field of a magnetic resonance apparatus is provided. For example, the magnetic field is to be determined even more precisely than before.

Accordingly, a method for ascertaining a magnetic field of at least one magnetic coil unit of a magnetic resonance apparatus (e.g., a main magnet for generating a main magnetic field and/or a gradient coil unit for generating a gradient magnetic field) is provided. Herein, the magnetic field is generated by the at least one magnetic coil unit. A plurality of magnetic field vectors are detected at different positions in the magnetic field by a magnetic field sensor unit, where each magnetic field vector of the plurality of magnetic field vectors describes a strength (e.g., a magnitude) and a direction of the magnetic field at the respective position. A position may, for example, be a position in space and/or a point in space. Further, the magnetic field is ascertained, where, to ascertain the magnetic field based on the plurality of magnetic field vectors, a model of a vector field is ascertained. For example, the magnetic field ascertained may be described as a model of the vector field.

In one embodiment, the magnetic field ascertained may be used to correct the magnetic field and/or to take the magnetic field into account in a reconstruction of magnetic resonance signals. The magnetic field may, for example, be corrected with the aid of an adaptation of a current flow through the gradient coil unit and/or by dedicated shim coils.

One embodiment of the method provides that the different positions at which the plurality of magnetic field vectors are detected lie on a surface enclosing a volume of the magnetic field to be ascertained (e.g., an imaging volume of a magnetic resonance measurement).

A further embodiment of the method provides that the surface is a spherical surface (e.g., the surface of a sphere).

The magnetic field vectors may be detected with the aid of a static or dynamic field camera.

The magnetic field sensor unit may include at least one magnetic field sensor that, to detect the plurality of magnetic field vectors in sequence, is positioned on at least a part of the plurality of positions (e.g., by a robot).

The magnetic field sensor unit may include a plurality of magnetic field sensors that, to detect the plurality of magnetic field vectors, are positioned simultaneously on at least some positions of the plurality of positions.

A further embodiment of the method provides that the magnetic field ascertained is used to perform a quality control of the main magnet and/or the gradient coil unit during the manufacture of the magnetic resonance apparatus.

A further embodiment of the method provides that, to ascertain the magnetic field, the model of the vector field is decomposed into separate (e.g., orthogonal) submodels.

A further embodiment of the method provides that the ascertaining of the model of the vector field includes an expansion of the vector field according to spherical harmonic basis functions (e.g., scalar and real-valued).

In one embodiment, the vector model provides that the magnetic field is described based on three scalar components (e.g., orthogonal components). To ascertain the magnetic field, a mutually independent partial vector model is applied to each of the three components.

The three separate partial vector models may be combined to form an overall vector model.

A further embodiment of the method provides that, to ascertain the magnetic field, the vector model is fitted to the detected plurality of magnetic field vectors.

The fitting of the vector model to the detected plurality of magnetic field vectors may include ascertaining coefficients assigned to the spherical harmonic basis functions.

In one embodiment, to ascertain the coefficients assigned to the spherical harmonic basis functions, a system of equations (e.g., a linear system) is solved.

A further embodiment of the method provides that the ascertaining of the magnetic field includes ascertaining a dynamic model of a vector field.

The dynamic model of the vector field may be used to calibrate a vector gradient impulse response function.

In one embodiment, dynamic behavior of the magnetic field is determined by the generation of at least one gradient magnetic field.

For example, a dynamic behavior of the magnetic field may be used to calibrate dynamic deviations of the magnetic field (e.g., deviations caused by eddy currents).

A further embodiment of the method provides that, to ascertain the magnetic field, a plurality of partial contributions of the magnetic field are vectorially combined (e.g., added together).

A further embodiment of the method provides that, at at least one of the different positions, a first location of a detection of a first component of the magnetic field vector detected at this position has an offset to a second location of a second component of the magnetic field vector detected at this position. The offset is taken into account when ascertaining the magnetic field.

Further, an apparatus for ascertaining a magnetic field of at least one magnetic coil unit is provided. The apparatus includes a magnetic coil unit for generating the magnetic field, a magnetic field sensor unit for detecting a plurality of magnetic field vectors at different positions of the magnetic field, and an evaluation unit for ascertaining the magnetic field.

The advantages of the apparatus for ascertaining a magnetic field of at least one magnetic coil unit substantially correspond to the advantages of the method according to the present embodiments for ascertaining a magnetic field of at least one magnetic coil unit as set out in detail above. Features, advantages, or alternative embodiments may also be transferred to the other subject matter and vice versa.

Further provided is a computer program product that includes a program and may be loaded directly into a memory of a programmable evaluation unit (e.g., a magnetic resonance apparatus), and program means (e.g., libraries and auxiliary functions) for ascertaining a magnetic field based on detected magnetic field vectors when the computer program product is executed in the evaluation unit. Herein, the computer program product may include software with a source code that still has to be compiled and linked, or only has to be interpreted, or an executable software code that only needs to be loaded into the evaluation unit for execution. The computer program product enables the method according to the present embodiments to be executed quickly, identically repeatably, and robustly. The computer program product is configured such that the computer program product may execute the method acts using the evaluation unit. Herein, the evaluation unit is, in each case, to fulfil the requisite conditions such as, for example, having a corresponding random access memory, a corresponding graphics card, or a corresponding logic unit so that the respective method steps may be executed efficiently.

The computer program product is, for example, stored on a computer-readable medium or held on a network or server from where the computer program product may be loaded into the processor of a local evaluation unit that is, for example, directly connected to the magnetic resonance apparatus or may be embodied as part of the magnetic resonance apparatus. Further, control information of the computer program product may be stored on an electronically readable data carrier. The control information of the electronically readable data carrier may be embodied to perform a method according to the present embodiments when the data carrier is used in an evaluation unit. Examples of electronically readable data carriers are DVDs, magnetic tapes, or USB sticks on which electronically readable control information (e.g., software) is stored. When this control information is read from the data carrier and stored in an evaluation unit, all the embodiments of the above-described methods may be performed. Thus, the present embodiments may also be based on the computer-readable medium and/or the electronically readable data carrier.

BRIEF DESCRIPTION OF THE DRAWINGS

Further advantages, features, and details of the invention result from the exemplary embodiments described below and from the drawings. Corresponding parts are given the same reference characters in all the figures.

FIG. 4 shows an exemplary table describing scalar and vectorial spherical harmonic functions up to the third order;

DETAILED DESCRIPTION

Figure 1:
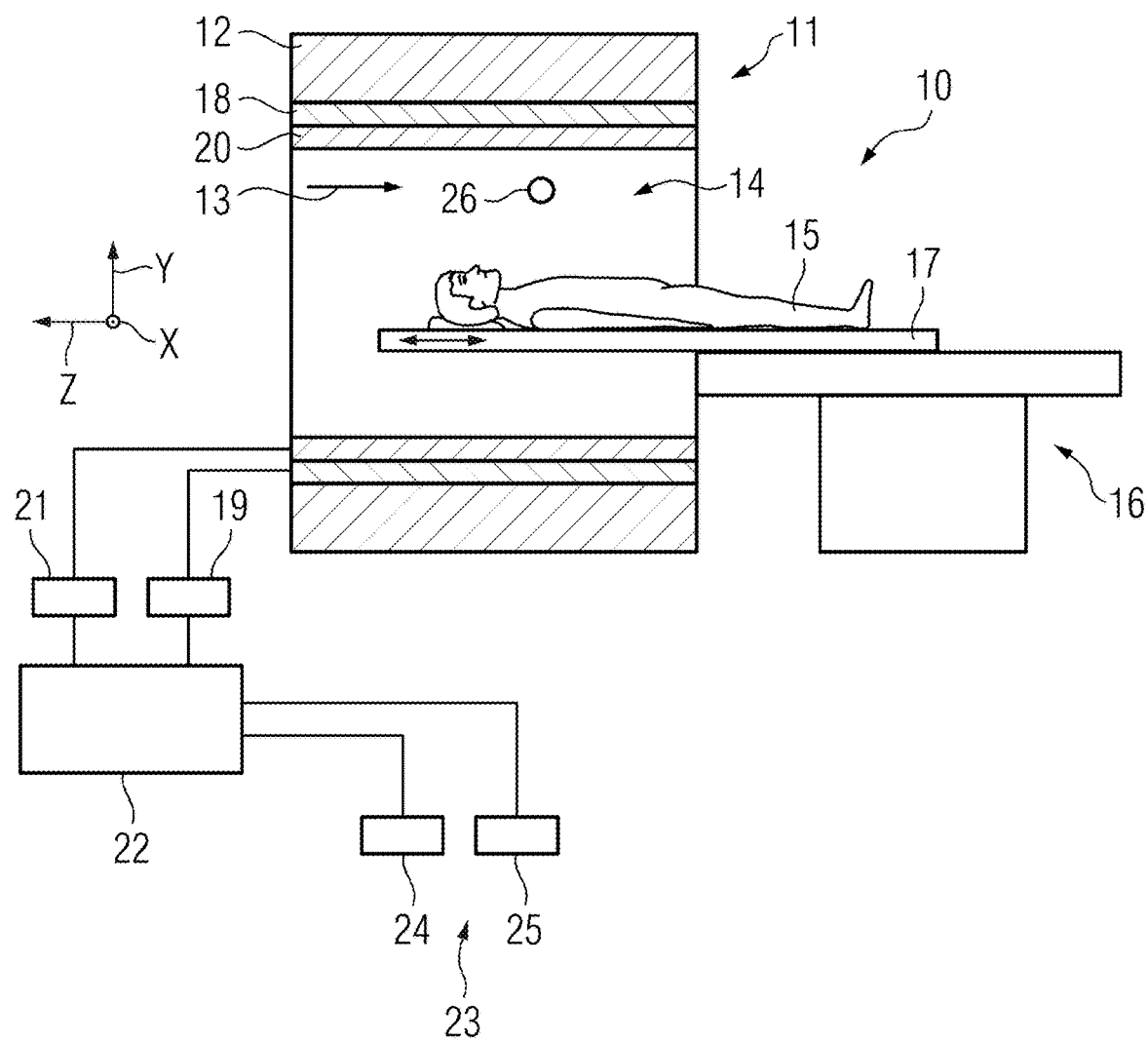
FIG. 1 shows one embodiment of a magnetic resonance apparatus with a magnetic field sensor unit.

FIG. 1 is a schematic representation of one embodiment of a magnetic resonance apparatus 10. The magnetic resonance apparatus 10 includes a magnet unit 11 with a main magnet 12 for generating a strong and, for example, temporally constant main magnetic field 13. Further, the magnetic resonance apparatus 10 includes a patient receiving region 14 for receiving a patient 15. In the present exemplary embodiment, the patient receiving region 14 is cylindrical in shape and includes an imaging volume in which imaging magnetic resonance signals are generated. However, in principle, a different embodiment of the patient receiving region 14 may be provided at any time. The patient 15 may be pushed into the patient receiving region 14 by a patient positioning apparatus 16 of the magnetic resonance apparatus 10. For this purpose, the patient positioning apparatus 16 has a patient table 17 that is embodied as movable within the patient receiving region 14.

The magnet unit 11 also includes a gradient coil unit 18 for generating a gradient magnetic field used for spatial encoding during imaging and that is superimposed on the main magnetic field. The gradient coil unit 18, for example, includes three gradient coils (not shown here in detail) a first one of the three gradient coils is provided to generate a magnetic field gradient along the axis X, a second one of the three gradient coils is provided to generate a magnetic field gradient along the axis Y, and a third one of the three gradient coils is provided to generate a magnetic field gradient along the axis Z. The gradient coil unit 18 is controlled by a gradient control unit 19 of the magnetic resonance apparatus 10.

The magnetic resonance apparatus 11 also includes a radio-frequency antenna unit 20 that, in the present exemplary embodiment, is embodied as a body coil permanently integrated into the magnetic resonance apparatus 10. The radio-frequency antenna unit 20 is controlled by a radio-frequency antenna control unit 21 of the magnetic resonance apparatus 10 and radiates radio-frequency magnetic resonance sequences into the imaging volume. This excites atomic nuclei in the imaging volume. Magnetic resonance signals are generated by relaxation of the excited atomic nuclei. The radio-frequency antenna unit 20 is embodied to receive the resonance signals.

To control the main magnet 12, the gradient control unit 19 and to control the radio-frequency antenna control unit 21, the magnetic resonance apparatus 10 has a system control unit 22. The system control unit 22 controls the magnetic resonance apparatus 10 centrally (e.g., by performing a predetermined imaging gradient echo sequence). Further, the system control unit 22 includes an evaluation unit (not shown in further detail) ascertaining the magnetic field generated by the main magnet 11 and/or the gradient coil unit 18.

In addition, the magnetic resonance apparatus 10 includes a user interface 23 connected to the system control unit 22. Control information, such as, for example, imaging parameters, and reconstructed magnetic resonance images may be displayed on a display unit 24 (e.g., on at least one monitor) of the user interface 23 for a medical operator. Further, the user interface 23 has an input unit 25, by which information and/or parameters may be entered by the medical operator during a measuring process.

The magnetic resonance apparatus 10 further includes a magnetic field sensor unit 26 for detecting the magnetic field (e.g., for detecting at least one magnetic field vector). The magnetic field sensor unit 26 may, for example, includes a field camera (e.g., static or dynamic) and/or one or more magnetometers.

Figure 3:
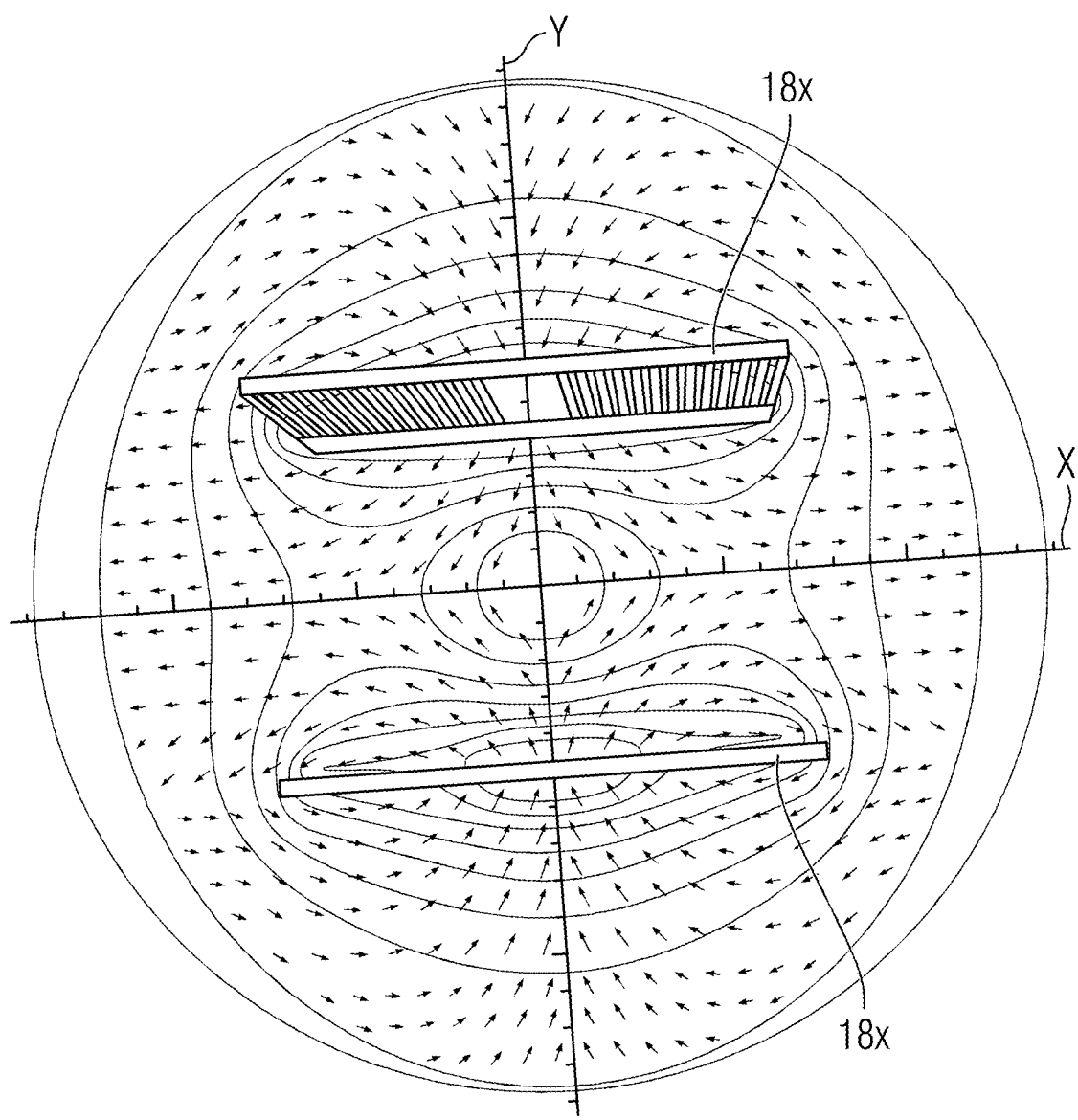
FIG. 3 shows an exemplary magnetic field distribution generated by a planar gradient coil.

FIG. 3 is intended to show by way of example that a gradient coil for generating a magnetic field gradient along the specific axis (e.g., the X-axis) actually also generates magnetic field components that are not aligned in the direction of the specific axis. The distribution of the magnetic field shown in FIG. 3 is generated by a flat gradient coil 18x. Although this gradient coil 18x is only intended to generate a magnetic field along the X-axis, the magnetic field has a quadrupolar distribution so that a "concomitant" gradient term also occurs along the Y-axis. The approaches disclosed here enable better account to be taken of such deviations and other deviations when ascertaining the magnetic field.

Figure 2:
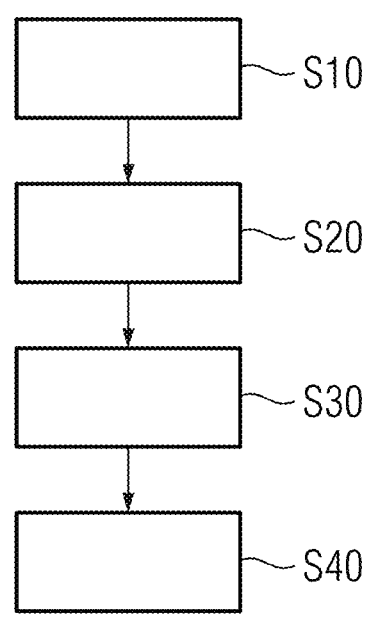
FIG. 2 shows a possible sequence of a method for ascertaining a magnetic field of at least one magnetic coil unit of a magnetic resonance apparatus.

FIG. 2 is intended to illustrate a method for ascertaining a magnetic field of at least one magnetic coil unit of a magnetic resonance apparatus by way of example. In S10, a magnetic field is generated by at least one magnetic coil unit (e.g., by the main magnet 11 and/or the gradient coil unit 18). In S20, a plurality of magnetic field vectors are detected at different positions of the magnetic field by a magnetic field sensor unit, where each magnetic field vector of the plurality of magnetic field vectors describes a strength (e.g., a magnitude) and a direction of the magnetic field at the respective position. In S30, the magnetic field is ascertained, where, to ascertain the magnetic field based on the plurality of magnetic field vectors, a model of a vector field is ascertained. In S40, the magnetic field ascertained is further processed (e.g., by correcting the real magnetic field and/or taking account of the magnetic field ascertained in a reconstruction of magnetic resonance signals received by the magnetic resonance apparatus 10).

The following explanations serve as a background for a better understanding of the present embodiments.

A scalar field or a vector field that is equal to zero when the Laplacian $\Delta$ is applied thereto is referred to as a harmonic field. Scalar spherical harmonic functions (e.g., spherical harmonics) $f(r)$ and vectorial spherical harmonic functions $F(r)$ are orthogonal solutions of Laplace's equation (e.g., $\Delta f(r)=0$ and $\Delta F(r)=0$). The vector field may be expressed in Cartesian coordinates as F(x,y,z)=iF$_x$(x,y,z)+ jF$_y$(x,y,z)+kF$_z$(x,y,z) with respect to the location vector r(x,y,z)=ix+jy+kz.

Each harmonic field may be decomposed into a weighted sum of orthogonal spherical harmonic functions. A model of a vector field may be described as a weighted sum of vectorial spherical harmonic functions. A model of a scalar field may be described as a weighted sum of scalar spherical harmonic functions.

While the terms in the second column of the table shown in FIG. 4 for the scalar spherical harmonic functions SSH are known from the prior art, the terms shown in the third, fourth and fifth columns have been analytically calculated for the corresponding vectorial spherical harmonic functions VSH for the first three orders/by applying the gradient operator to the scalar spherical harmonic functions from the second column.

For example, the vectorial spherical harmonic function VSH(r) corresponding to the scalar spherical harmonic function SSH(r)=2z$^2$−x$^2$−y$^2$ may be expressed as VSH(r)=i(−2x)+j(−2y)+k(4z).

The following findings have been applied to improve the ascertaining of a magnetic field of a magnetic resonance apparatus: inside the spatial regions in which no electric current flows, the magnetic field in the form of a vector field B may be described as a harmonic field. The scalar field B=|B| does not necessarily behave as a harmonic field. This is shown below:

According to Maxwell's equations $$\begin{cases} \nabla \times B = \mu_0 J + \dfrac{1}{c^2}\dfrac{\partial E}{\partial t} \\ \nabla \cdot B = 0 \end{cases}$$

for a magnetostatic state within the whole imaging volume, the vector field B is to have vanishing divergence and a negligible rotation, since the displacement current and the "real" current may be ignored. Since there are usually no metals within the imaging volume, there is also no electric current (J=0), and dielectric effects may be neglected, at least for static or quasi-static states (E is constant over time). Displacement currents allowed to occur within the imaging volume during a magnetic resonance examination are anyway limited to less than 100 μA by regulatory specifications in order to avoid peripheral nerve stimulation and/or direct muscle stimulation. Thus, in the case of a quasi-static state, the aforementioned Maxwell's equations may be simplified to:

$$\begin{cases} \nabla \times B = 0 \\ \nabla \cdot B = 0 \end{cases}$$

The Laplacian applied to the vector field B may be formulated mathematically as ΔB=∇(∇·B)−∇×(∇×B). If the simplified Maxwell's equations are inserted here, the result is ΔB=0 (e.g., the vector field B is a harmonic field). Expressed in Cartesian coordinates, this is:

$$\Delta B = \frac{\partial^2 B}{\partial x^2} + \frac{\partial^2 B}{\partial y^2} + \frac{\partial^2 B}{\partial z^2} = i\Delta B_x + j\Delta B_y + k\Delta B_z = 0$$

This analysis by the inventor finally leads to the important finding:

$$\Delta B_x = \Delta B_y = \Delta B_z = 0$$

This provides that not only the vector field B itself, but also three orthogonal scalar components B$_x$, B$_y$ and B$_z$ of the vector field B are each a harmonic field or may be described as such. The present embodiments apply this fundamentally new and surprising finding in order to ascertain the magnetic field in an improved manner. For example, this finding enables the model of the magnetic field to be optimized. For example, this finding enables the magnetic field to be ascertained more accurately and/or more quickly.

Thus, it, for example, follows that it is sufficient to detect magnetic field vectors (e.g., the vectorial magnetic field) at a specific number of local positions (e.g., discrete local positions) in order to ascertain the magnetic field therewith (e.g., a distribution and/or a model of the magnetic field). In one embodiment, the volume of the magnetic field ascertained in this way includes the entire imaging volume (e.g., the entire volume enclosed by the positions at which the vectorial magnetic field is detected).

By contrast, conventionally, scalar magnetic field models are applied; although a harmonic decomposition of a scalar magnitude B=|B| of the vectorial magnetic field B is harmonic, the resulting field model is not necessarily so. Thus, such a field model is not accurate.

Figure 5:
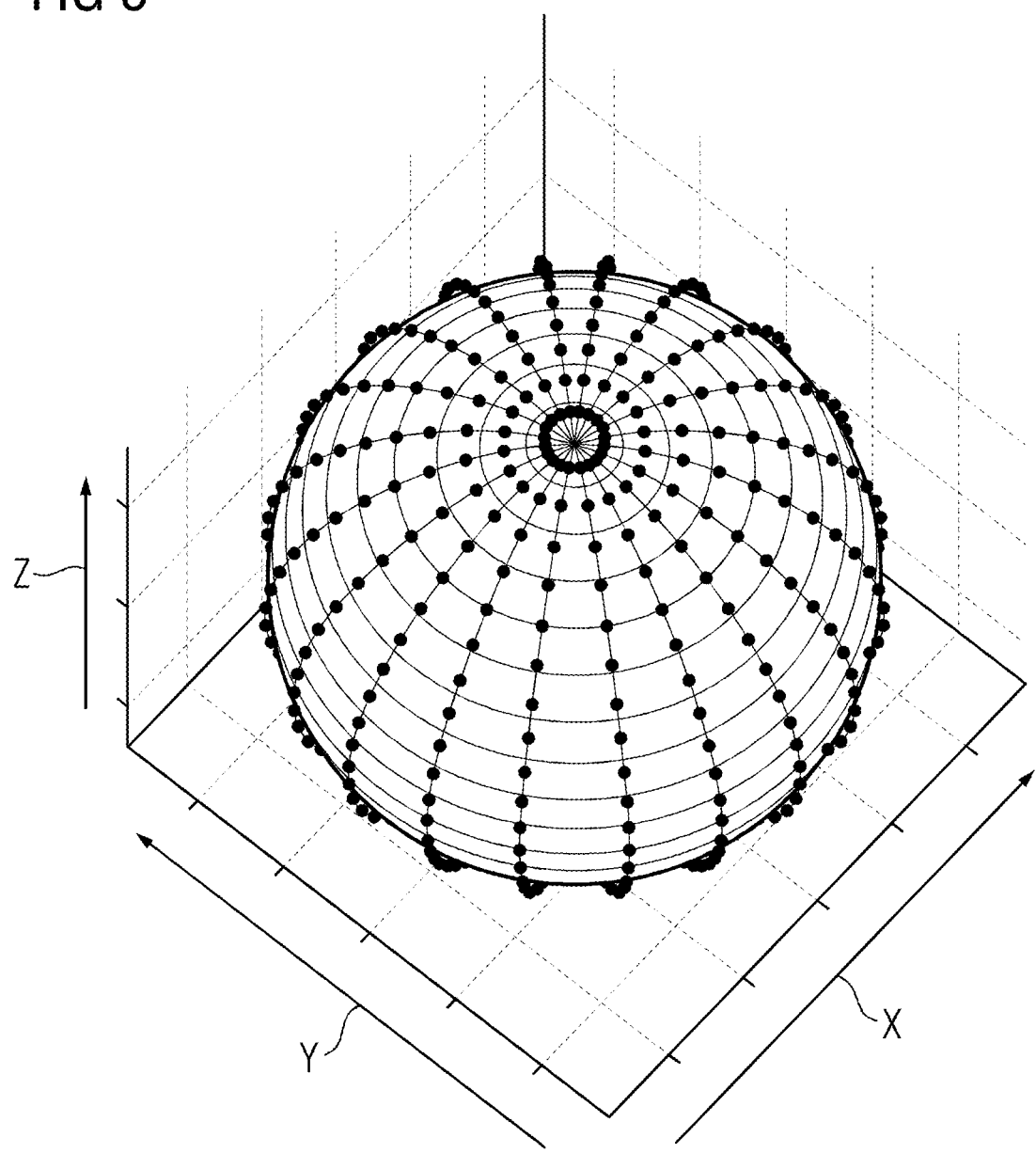
FIG. 5 shows an exemplary scanning pattern of a spherical surface with 480 scanning positions.

As shown by way of example in FIG. 5, a magnetic field vector may, for example, in each case, be detected at N different positions distributed over an area enclosing an imaging volume of the magnetic resonance apparatus. This then results in a set of N multi-dimensional (e.g., three-dimensional) sampling points. The magnetic field vectors may, for example, be detected with the aid of a static or dynamic field camera.

A static field camera may be suitable for sampling a field distribution that does not change or only changes slightly over the period in which the sampling of the N measuring points takes place. A static field camera may, for example, include only one magnetometer (e.g., vector magnetometer), which is sequentially positioned at the N detection positions with the aid of a robotic arm.

A dynamic field camera includes, for example, N (vector) magnetometers arranged on a carrier structure so that magnetometers are positioned at the N detection positions. A camera of this kind may, for example, detect a dynamic expansion of a magnetic field caused, for example, by modulation due to the operation of gradient coils. For example, a camera of this kind may be used to calibrate dynamic field disturbances and/or field deviations, such as, for example, those caused by eddy currents generated by fast switching of gradient pulses.

A set of N magnetic field vectors (e.g., three-dimensional sampling points) includes, for example, 3*N field values that may be expressed as follows: B$_{x,m}$(x$_m$,y$_m$,z$_m$), m=1 . . . N as projections of the magnetic field vector B at the positions (x$_m$,y$_m$,z$_m$) onto an X-axis, B$_{y,n}$(x$_n$,y$_n$,z$_n$), n=1 . . . N as projections of the magnetic field vector B at the positions (x$_n$,y$_n$,z$_n$) onto a Y-axis and B$_{z,o}$(x$_o$,y$_o$,z$_o$), o=1 . . . N as projections of the magnetic field vector B at the positions (x$_o$,y$_o$,z$_o$) onto a Z-axis.

Figure 6:
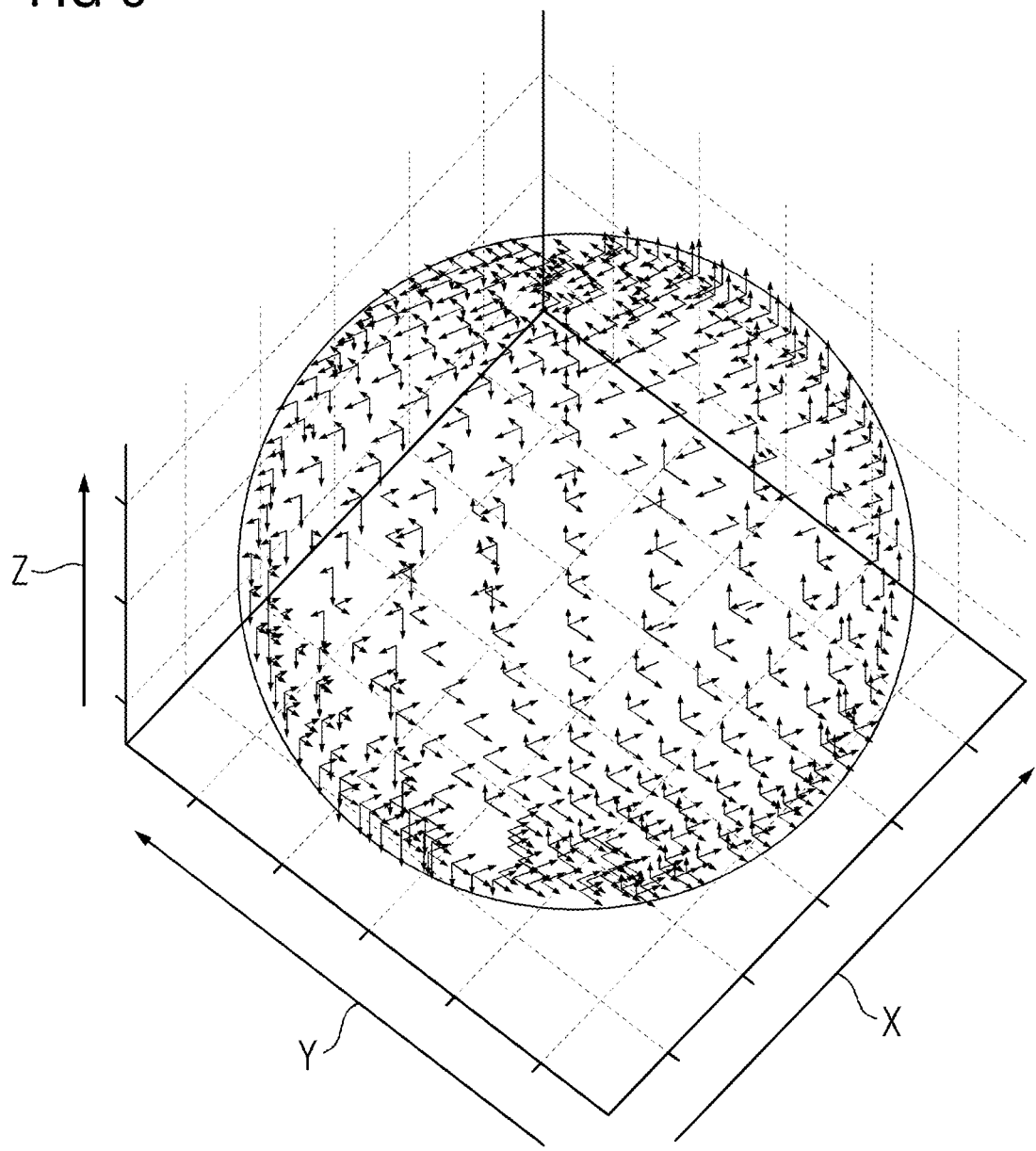
FIG. 6 shows an exemplary representation of detected magnetic field vectors.

It may, for example, be provided for some of these coordinate values to be the same (e.g., depending on the structure of the field camera). For example, x$_m$=x$_n$=x$_o$ may be valid for all m=n=o. FIG. 6 shows exemplary magnetic field vectors in a magnetic field generated by a gradient coil in a static state (e.g., the current flowing though the gradient coil is constant over time). At each sampling point, three values are depicted in the form of small arrows corresponding to the three orthogonal field components $B_x$, $B_y$ and $B_z$. Herein, in this case, no main magnetic field is superimposed ($B_0=0$), so that, for example, the state corresponds to an application in which a gradient coil is characterized during a production process of a magnetic resonance apparatus prior to installation in a main magnet.

In one embodiment, to ascertain the magnetic field, the vector model is fitted to the detected plurality of magnetic field vectors. For example, herein, a mathematical model is fitted to real field values. Herein, the plurality of magnetic field vectors are, for example, the above-described N magnetic field vectors.

The fitting of the model may, for example, be calibration of the vector model. In one embodiment, the calibrated vector model enables magnetic field values to be calculated at each position within the imaging volume. Thus, sampling of relatively few positions N advantageously enables the magnetic field to be ascertained at any other position within the imaging volume (e.g., even outside the imaging volume, the vector model is able to predict the field distribution if this space is free of electric currents, such as J=0, and displacement currents, such as dE/dt=0.)

For this purpose, decomposition (e.g., series expansion) into basis functions (e.g., orthogonal basis functions) is performed. In one embodiment, coefficients of the basis functions are ascertained by fitting the vector model as well as possible to the detected magnetic field vectors. The coefficients ascertained in this way may be used to ascertain magnetic field values (e.g., magnetic field vectors at any position of the imaging volume).

The ascertaining of the model of the vector field or the modeling of the magnetic field may be performed for each set of N detected magnetic field vectors (e.g., also for a main magnetic field $B_0$) generated by a superconducting main magnet of, for example, 1.5 T or 3 T, with or without an additional gradient magnetic field.

The ascertaining of the model of the vector field or modeling of the magnetic field may further be performed for each set of N magnetic field vectors detected at different times t; it is, for example, possible for a dynamic expansion of the vector field B(t) to be modeled (e.g., for $B(t)=B_0+B_g(t)$), where $B_0$ is a static main magnetic field, and $B_g(t)$ is a variable gradient magnetic field. The entire magnetic field B(t) results, for example, from a vectorial addition of the main magnetic field $B_0$ with the gradient magnetic field $B_g(t)$.

For example, a magnetic field of a magnetic field generating component of a magnetic resonance apparatus may be ascertained. For example, a gradient magnetic field generated by a gradient coil unit may be generated (e.g., modeled) outside a magnetic resonance apparatus. This may, for example, be performed for quality control during the manufacture of the magnetic resonance apparatus. For this purpose, the gradient coil unit may, for example, be operated with a constant current and/or dynamic current pulses.

Further, it is possible for a static main magnetic field generated by a main magnet (e.g., a superconducting main magnet) to be ascertained (e.g., modeled). This may, for example, be performed during the manufacture of the magnetic resonance apparatus (e.g., if the main magnet is not yet sealed within a helium container). For example, this may take place during quality control as part of a room temperature plot (RTP) and/or a low current plot (LCP).

In one embodiment, to ascertain the magnetic field, the model of the vector field may be decomposed into separate submodels (e.g., orthogonal submodels). As already described, a separate field model may be calibrated for each of the three scalar components $B_x$, $B_y$ and $B_z$. These scalar components may further be combined to obtain a vector model for a vector field distribution. The expression $B=iB_x+jB_y+kB_z$ may be used for this.

In one embodiment, the model of the vector field is ascertained with an expansion of the vector field in accordance with spherical harmonic basis functions (e.g., scalar and real valued). According to the above statements, a field decomposition, for example, for which scalar and real-valued spherical harmonic functions expressed in Cartesian coordinates are used as basis functions, may be performed.

In the following, the notation B*(r) represents field values estimated from the model of the vector field. The notation B(r) represents actual field values. In Cartesian coordinates, the model of the vector field may be expressed by $B^*(r)=iB_x^*(r)+jB_y^*(r)+kB_z^*(r)$.

For example, a scalar field model may be optimized for each orthogonal field component by a series expansion (e.g., finite series expansion) in accordance with scalar spherical harmonic functions.

In one embodiment, to ascertain the magnetic field, the vector model is fitted to the detected plurality of magnetic field vectors. For example, the detected magnetic field vectors enable the coefficients of the series expansion to be optimized, such that the estimated magnetic field B*(r) matches the actual magnetic field B(r) as closely as possible. The coefficients averaged in this way may be used to determine the magnetic field at any position (e.g., within the imaging volume).

The three orthogonal components of the vector field may be expressed as follows:

$$B_x^*(r) = \sum_{h=1}^{H} CX_h \cdot SH_h(r)$$

$$B_y^*(r) = \sum_{h=1}^{H} CY_h \cdot SH_h(r)$$

$$B_z^*(r) = \sum_{h=1}^{H} CZ_h \cdot SH_h(r)$$

Thus, the vector field model may be described as a sum of scalar spherical harmonic functions $SH_h(r)$ weighted by a vectorial series expansion coefficient $C_h=(iCX_h+jCY_h+kCZ_h)$:

$$B^*(r) = \sum_{h=1}^{H} (iCX_h + jCY_h + kCZ_h) \cdot SH_h(r) = \sum_{h=1}^{H} C_h \cdot SH_h(r)$$

The accuracy of the field model results from the number of expansion terms H; a higher H results in higher accuracy at the expense of higher computational effort. In one embodiment, a higher number of expansion terms H is suitable when a higher number of magnetic field vectors are detected. In one embodiment, a number of expansion terms H is selected, which is sufficient to cope with the complexity of the magnetic field to be ascertained and minimizes the computational effort.

The real-valued coefficients $CX_h$, $CY_h$ and $CZ_h$, h=1 ... H are model parameters to be optimized during fitting. The location vector r describes the local position of the magnetic field. The location vector r may, for example, be expressed in Cartesian coordinates r(x,y,z), spherical coordinates r(r, θ, φ), or other suitable coordinates. The spherical harmonic functions $SH_h$, h=1 ... H used as basis functions may be selected according to the second column of the table shown in FIG. 4, where the indices increase according to the order l. For example, a field decomposition up to the second order (e.g., l=0, 1, and 2) has the first nine of the spherical harmonic functions given in the table. This provides that each field model includes H=9 parameters or coefficients that are fitted. To obtain a more accurate magnetic field model, it is, for example, possible to perform a series expansion up to H=16 with the spherical harmonic functions $SH_h$ up to the third order (e.g., l=0, 1, 2, and 3), so that sixteen parameters or coefficients are ascertained. To achieve even higher accuracy, it is also possible to use a higher number of expansion terms H>16. Further, it is also possible to use a different number of expansion terms for the different field components X, Y, and Z (e.g., $H_x \approx H_y \approx H_z$).

The following describes a possible fitting of the magnetic field model to the actual magnetic field (e.g., the detected magnetic field vectors). The fitting of the vector model to the detected plurality of magnetic field vectors, for example, includes ascertaining the coefficients assigned to the spherical harmonic basis functions (e.g., spherical harmonic functions). To ascertain the coefficients assigned to the spherical harmonic basis functions, a system of equations (e.g., a linear system), for example, is solved.

The fitting takes place, for example, by adapting the model parameters $CX_h$, $CY_h$ and $CZ_h$. In the following exemplary embodiment, a fitting for the field component X is shown. This may be easily transferred to the other field components Y and Z.

For example, for N magnetic field vectors B at the positions $r_m$, m=1 ... N, the measured values $B_{x,m}(x_m,y_m,z_m)$ are detected, where these measured values are projections of the vector $B_m$ onto the X-axis. As already explained, the orthogonal components X of the vector field may be expressed with $$B_x^*(r) = \sum_{h=1}^{H} CX_h \cdot SH_h(r)$$

Applying this equation to the detected measured values produces a system of N independent equations for H unknown coefficients $CX_h$, h=1 ... H:

$$B_x^*(r_m) = \sum_{h=1}^{H} CX_h \cdot SH_h(r_m)$$

This system of equations is determined for N=H or overdetermined for N>H. Various methods are known to the person skilled in the art for solving such a system of equations. For example, an ordinary least squares (OLS) method may be applied to solve an overdetermined system of equations. A further possible method for ascertaining the unknown coefficients $CX_h$ may include reformulation as an optimization problem and minimization of a cost function, expressed, for example, as the sum of the least squares of the fitting error $$\min \sum_{m=1}^{N} [B_x(r_m) - B_x^*(r_m)]^2$$

Further, it is possible to use suitable software tools, libraries, and open source code, such as, example, Matlab or Mathematica to ascertain the magnetic field (e.g., the vector model describing the magnetic field). In order to obtain the complete vector model of the magnetic field, the above-described method for the field component X may also be applied analogously (e.g., repeated) for the field components Y and Z, so that $B_y^*(r)$ and $B_z^*(r)$ are obtained.

The ascertaining of the magnetic field may include ascertaining a dynamic model of a vector field. For example, a dynamic model of a vector field (e.g., with a non-stationary temporal expansion) may be calibrated in time windows of a magnetic resonance measurement according to a method described above. For example, this may have the result that different values are ascertained for model parameters $CX_h$, $CY_h$ and $CZ_h$, h=1 ... H in the different time windows.

In addition to the method presented here for the decomposition and/or modeling of the vector field, further methods may also be provided.

One embodiment of the method provides that the dynamic model of the vector field is used to calibrate a vector gradient impulse response function VGIRF. This calibration may, for example, take place for all three gradient axes X, Y, and Z.

To calibrate the VGIRF (e.g., a gradient coil of the gradient coil unit, such as for the X-axis) may be operated with a current with a predetermined form (e.g., in the form of a rectangular pulse or a triangular pulse). From this, the gradient impulse response function, according to the example for the X-axis: VGIRFX, may be calculated from the dynamic expansion of the vector field. In one embodiment, the calibrated gradient impulse response function VGIRFX may be used to ascertain the gradient magnetic field $BGX(r,t)$ resulting from an arbitrary current flow $I_x(t)$ through the gradient coil for the X-axis based on a convolution of the gradient impulse response function VGIRFX and the current flow $I_x(t)$:

$$BGX(r,t) = VGIRFX \otimes I_x(t)$$

Similarly, the gradient impulse response functions VGIRFY and VGIRFZ may be ascertained for the Y-axis and the Z-axis and applied to determine the gradient magnetic fields $BGY(r,t)$ and $BGZ(r,t)$.

It is further embodiment, to ascertain the magnetic field, a plurality of partial contributions of the magnetic field are vectorially combined (e.g., added together). For example, it is possible for different calibrated vector field models to be combined in order to correct deviations of the magnetic field (e.g., during an imaging magnetic resonance measurement). Such deviations may, for example, be a non-uniform (e.g., inhomogeneous) distribution of the main magnetic field B0 (e.g., static main magnetic field B0) and/or a non-ideal (e.g., non-linear) distribution of a gradient magnetic field, which is usually used for spatial encoding of magnetic resonance signals. Such deviations are, for example, known as non-linearities, inherent Maxwell terms, "concomitant" or "crossover" terms. Further possible sources of magnetic field deviations are any eddy currents that occur.

For the sake of simplicity, in the following, the notation will no longer distinguish between the actual magnetic field distribution $B(r)$ and the modeled magnetic field distribution $B^*(r)$; in most cases, this notation refers to the field values calculated using the calibrated model.

For example, the field values of the above-described field models may be combined (e.g., added together) in order thereby to obtain a complete model of the vector field. This model may cover the entire imaging volume, which may be used, for example, for image reconstruction and/or for field correction.

According to the prior art, scalar field models are used for the magnitude of the magnetic field B (e.g., the main magnetic field $B_0$ and the gradient magnetic fields GX, GY and GZ); these scalar field models are added up in a scalar manner to produce a complete field model (e.g., $B(r)=B_0(r)+GX(r)+GY(r)+GZ(r)$).

In contrast to the prior art, it is not scalar field models that are provided here, but vectorial field models. Thus, in one embodiment, not only the field strength along the main axis (e.g., usually the Z-axis) is known, but also the field values along the X- and Y-axes orthogonal thereto. In deviation from the prior art, a vectorial sum of the individual field contributions may be formed. The field contributions, for example, includes the main magnetic field and the gradient magnetic fields. The magnetic fields may be represented using vectors with three orthogonal Cartesian components so that the addition of the magnetic fields may be reduced to three scalar additions of the components.

If, for example, a main magnetic field $B_0(r)=iB_{0x}(r)+jB_{0y}(r)+kB_{0z}(r)$ and a gradient magnetic field of the gradient coil of the X-axis $GX(r)=iGX_x(r)+jGX_y(r)+kGX_z(r)$ are generated, the magnetic field expressed by vectors $B(r)=B_0(r)+GX(r)$ is obtained; for each component, the magnetic field may be expressed by scalar quantities: $B_x(r)=B_0x(r)+GX_x(r)$, $B_y(r)=B_{0y}(r)+GX_y(r)$ and $B_z(r)=B_{0z}(r)+GX_z(r)$.

If, for example, in each case, a partial gradient magnetic field is generated simultaneously by the gradient coils of the X-axis, the Y-axis, and the Z-axis in addition to the main magnetic field, which may, for example, be provided for magnetic resonance sequences with a spiral and/or radial trajectory, the sum of the vector fields $B(r)=B_0(r)+GX(r)+GY(r)+GZ(r)$ may be expressed by scalar components with $B_x(r)=B_0x(r)+GX_x(r)+GY_x(r)+GZ_x(r)$, $B_y(r)=B_{0y}(r)+GX_y(r)+GY_y(r)+GZ_y(r)$ and $B_z(r)=B_{0z}(r)+GX_z(r)+GY_z(r)+GZ_z(r)$.

In one embodiment, a magnetic field is ascertained that does not include a contribution from a static main magnetic field, but only contributions from one or more gradient magnetic fields. This may, for example, be useful for characterizing the gradient coil unit during the production process of a magnetic resonance apparatus (e.g., for quality control) before the gradient coil unit is installed in the main magnet. The detected plurality of magnetic field vectors may, for example, be used to calibrate a separate magnetic field model for each gradient axis. Since, in this case, there is no main magnetic field (e.g., $B_0(r)=0$), only the gradient magnetic field generated by the gradient coil unit is sampled (e.g., a gradient magnetic field as shown in FIG. 3), which is generated by a gradient coil assigned to the X-axis. The model of the vector field ascertained for this purpose enables the gradient magnetic field GX(r,ix) generated by this gradient coil to be calculated for any current flow ix at any position r within the imaging volume. Similarly, a model of the vector field may also be ascertained for the gradient coils of the gradient coil unit assigned to the Y-axis and the Z-axis.

A further embodiment of the method provides that a gradient magnetic field is ascertained, where, in addition to the gradient magnetic field, a main magnetic field superimposed thereon is provided. For this purpose, for example, a plurality of magnetic field vectors of a magnetic field are detected at the edge of the imaging volume. The main magnetic field may, for example, have inhomogeneities. The gradient magnetic field is, for example, driven by a constant current flow ix through a gradient coil assigned to the X-axis; a plurality of magnetic field vectors $B(r,ix)=B_0(r)+GX(r,ix)$ are detected at different positions r. In one embodiment, in addition, the main magnetic field $B_0(r)$ is calibrated; for this purpose, magnetic field vectors are also detected at the different positions r, where the current flow ix is zero during this acquisition (e.g., ix=0). The field model for the gradient coil assigned to the X-axis may be ascertained from a subtraction of the models of the vector fields: $GX(r,ix)=B(r,ix)-B_0(r)$.

In addition to these embodiments described in detail of combined models of vector fields, other embodiments may also be provided (e.g., a combination of a main magnetic field with a plurality of, such as three, gradient magnetic fields).

Further, a local strength of the magnetic field B(r) may be determined using a magnetic field B(r) ascertained in the form of a model of a vector field. For example, for this purpose, it is possible to ascertain the magnitude $B(r)=|B(r)|$ of the vector field. In one embodiment, the strength of the magnetic field B(r) is used to model and/or evaluate magnetic resonance signals. For example, the angular frequency $\omega(r)$ of a magnetic resonance signal created at a position r may be ascertained with $\omega(r)=\gamma|B(r)|$, where $\gamma$ is the gyromagnetic ratio of water protons.

A further embodiment of the method provides that, at least one of the different positions, a first location of a detection of a first component of the magnetic field vector detected at this position has an offset to a second location of a second component of the magnetic field vector detected at this position, where the offset is taken into account when ascertaining the magnetic field.

Figure 7:
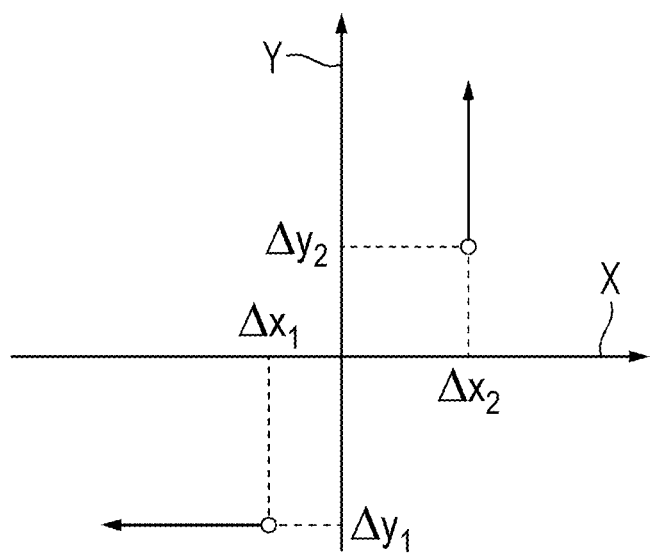
FIG. 7 shows one embodiment of a magnetometer with two independent partial sensors.

For clarification, FIG. 7 shows a magnetometer for detecting a magnetic field vector at a specific position $r_m$, m=1 ... N. To simplify the representation, the representation only includes two independent partial sensors, one for detecting a component in the X direction and another for detecting a component in the Y direction. In one embodiment, the magnetometer also includes a partial sensor (not shown here) for detecting a component in the Z direction. Compared to a reference point, the partial sensors have an offset (e.g., usually small). For example, the partial sensor for detecting the component in the X direction is offset by $\Delta x_1$ and in the Y direction by $\Delta y_1$. If this offset did not exist, all three orthogonal vector components $B_x(r_m)$, $B_y(r_m)$ and $B_z(r_m)$ of the magnetic field vector $B(r_m)$ would be measured at exactly the same location $r_m$.

In one embodiment, when ascertaining the magnetic field, account is taken of the fact that any magnetometers have three independent partial sensors, where each of the partial sensors is provided for one of the spatial directions X, Y, or Z, and the sensors are offset relative to one another. For example, a magnetometer of this kind detects the orthogonal components $B_y$, $B_y$, and $B_z$ of the magnetic field vector B at a slightly different location in each case. This may be expressed in the following way:

$B_x(x_1,y_1,z_1)$ is the projection of the vector $B(x_1,y_1,z_1)$ at the location $(x_1,y_1,z_1)$ onto the X-axis.

$B_y(x_2,y_2,z_2)$ is the projection of the vector $B(x_2,y_2,z_2)$ at the location $(x_2,y_2,z_2)$ onto the Y-axis.

$B_z(x_3,y_3,z_3)$ is the projection of the vector $B(x_3,y_3,z_3)$ at the location $(x_3,y_3,z_3)$ onto the Z-axis.

The locations $(x_1,y_1,z_1)$, $(x_2,y_2,z_2)$ and $(x_3,y_3,z_3)$ are usually in close proximity to the sampling point r. The locations may be described by the following formulation:

$r_m=\{(x_{1m},y_{1m},z_{1m}),(x_{2m},y_{2m},z_{2m}),(x_{3m},y_{3m},z_{3m})\}$

In the following, the notation B*(r) is again used for field values derived from the model of the vector field, and the notation B(r) is used for field values detected (e.g., by the magnetometer). In one embodiment, the vector field is modeled by a weighted sum of the vector spherical harmonic functions VSH according to the table shown in FIG. 4:

$$B^*(r) = \sum_{h=1}^{H} C_h \cdot VSH_h(r)$$

The real-valued coefficients $C_h$, h=1 . . . H are the optimizing model parameters for achieving the best possible fit. The location vector r(x,y,z)=ix+jy+kz describes the position at which the magnetic field is evaluated. The values of the field components at the locations at which each individual field component is measured may be expressed as follows: $B^*_x(x_{1m},y_{1m},z_{1m})=i\cdot B^*(x_{1m},y_{1m},z_{1m})$, $B^*_y(x_{2m},y_{2m},z_{2m})=j\cdot B^*(x_{2m},y_{2m},z_{2m})$ and $B^*_z(x_{3m},y_{3m},z_{3m})=k\cdot B^*(x_{3m},y_{3m},z_{3m})$. The symbol "·" stands for a scalar product of two vectors. Applying the preceding equations for the total number of 3*N magnetic field values detected at the positions $r_m$, m=1 . . . N produces a number of 3*N independent linear equations with a number of H unknowns $C_h$, h=1 . . . H. Possible methods for solving a system of equations of this kind have already been presented above.

Finally, reference is made once again to the fact that the methods described in detail above and the evaluation unit and magnetic resonance apparatus presented are only exemplary embodiments that may be modified by the person skilled in the art in a wide variety of ways without departing from the scope of the invention. Further, the use of the indefinite article "a" or "an" does not preclude the possibility that the features in question may also be present on a multiple basis. Likewise, the term "unit" does not preclude the possibility that the components in question may consist of a plurality of interacting partial components, which may also be spatially distributed.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for ascertaining a magnetic field of at least one magnetic coil unit of a magnetic resonance apparatus, the method comprising:
generating, by the at least one magnetic coil unit, the magnetic field, the at least one magnetic coil unit comprising a main magnet for generating a main magnetic field, a gradient coil unit for generating a gradient magnetic field, or the main magnet and the gradient coil unit;
detecting, by a magnetic field sensor unit including at least one magnetic field sensor, a plurality of magnetic field vectors at different positions of the magnetic field, wherein each magnetic field vector of the plurality of magnetic field vectors describes a strength and a direction of the magnetic field at the respective position;
ascertaining, by a processor, the magnetic field, the ascertaining of the magnetic field comprising ascertaining a model of a vector field based on the plurality of magnetic field vectors; and
adjusting the generating of the magnetic field based on the ascertained magnetic field, reconstructing magnetic resonance signals taking the ascertained magnetic field into account, or the adjusting and the reconstructing,
wherein ascertaining the magnetic field comprises decomposing the model of the vector field into separate submodels.

2. The method of claim 1, wherein the different positions, at which the plurality of magnetic field vectors are detected, lie on a surface enclosing a volume of the magnetic field to be ascertained.

3. The method of claim 2, wherein the volume of the magnetic field to be ascertained is an imaging volume of a magnetic resonance measurement.

4. The method as claimed in claim 2, wherein the surface is a spherical surface.

5. The method of claim 1, wherein the ascertained magnetic field is used to perform a quality control of the main magnet, the gradient coil unit, or the main magnet and the gradient coil unit during manufacture of the magnetic resonance apparatus.

6. The method of claim 1, wherein decomposing the model of the vector field into separate submodels comprises decomposing the model of the vector field into separate orthogonal submodels.

7. The method of claim 1, wherein the ascertaining of the model of the vector field comprises an expansion of the vector field according to spherical harmonic functions.

8. The method of claim 1, wherein ascertaining the magnetic field further comprises fitting the vector model to the detected plurality of magnetic field vectors.

9. The method of claim 8, wherein fitting the vector model to the detected plurality of magnetic field vectors comprises ascertaining coefficients assigned to the spherical harmonic functions.

10. The method of claim 9, wherein ascertaining the coefficients assigned to the spherical harmonic functions comprises solving a system of equations.

11. The method of claim 10, wherein the system of equations is a linear system of equations.

12. The method of claim 1, wherein ascertaining the magnetic field comprises ascertaining a dynamic model of a vector field.

13. The method of claim 12, further comprising calibrating a vector gradient impulse response function using the dynamic model of the vector field.

14. The method of claim 1, wherein ascertaining the magnetic field comprises vectorially combining a plurality of partial contributions of the magnetic field.

15. The method of claim 1, wherein, at one or more of the different positions, a first location of a detection of a first component of the magnetic field vector detected at the at least one position has an offset to a second location of a second component of the magnetic field vector detected at the at least one position, and wherein the offset is taken into account when ascertaining the magnetic field.

16. An apparatus for ascertaining a magnetic field of at least one magnetic coil unit, the apparatus comprising:
- a magnetic coil unit configured to generate the magnetic field, the magnetic coil unit comprising a main magnet for generating a main magnetic field, a gradient coil unit for generating a gradient magnetic field, or the main magnet and the gradient coil unit;
- a magnetic field sensor unit comprising at least one magnetic field sensor configured to detect a plurality of magnetic field vectors at different positions in the magnetic field, wherein each magnetic field vector of the plurality of magnetic field vectors describes a strength and a direction of the magnetic field at the respective position; and
- a processor configured to:
    - ascertain the magnetic field based on the plurality of magnetic field vectors, the ascertainment of the magnetic field comprising ascertainment of a model of a vector field; and
    - adjust the generation of the magnetic field based on the ascertained magnetic field, reconstruct magnetic resonance signals taking the ascertained magnetic field into account, or adjust the generation of the magnetic field based on the ascertained magnetic field and reconstruct the magnetic resonance signals taking the ascertained magnetic field into account, wherein the ascertainment of the magnetic field comprises decomposition of the model of the vector field into separate submodels.

17. In a non-transitory computer-readable storage medium that stores instructions executable by a programmable evaluation unit to ascertain a magnetic field of at least one magnetic coil unit of a magnetic resonance apparatus, the instructions comprising:
- generating the magnetic field by the at least one magnetic coil unit comprising a main magnet for generating a main magnetic field, a gradient coil unit for generating a gradient magnetic field, or the main magnet and the gradient coil unit;
- detecting a plurality of magnetic field vectors at different positions of the magnetic field by a magnetic field sensor unit comprising at least one magnetic field sensor, wherein each magnetic field vector of the plurality of magnetic field vectors describes a strength and a direction of the magnetic field at the respective position;
- ascertaining the magnetic field based on the plurality of magnetic field vectors, the ascertaining of the magnetic field comprising ascertaining a model of a vector field; and
- adjusting the generating of the magnetic field based on the ascertained magnetic field, reconstructing magnetic resonance signals taking the ascertained magnetic field into account, or the adjusting and the reconstructing,
- wherein ascertaining the magnetic field comprises decomposing the model of the vector field into separate submodels.

* * * * *